(12) United States Patent
Parsa et al.

(10) Patent No.: US 9,343,447 B2
(45) Date of Patent: May 17, 2016

(54) OPTICALLY PUMPED SENSORS OR REFERENCES WITH DIE-TO-PACKAGE CAVITIES

(71) Applicant: Texas Instruments Incorporated, Dallas, TX (US)

(72) Inventors: Roozbeh Parsa, Portola Valley, CA (US); William French, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/697,834

(22) Filed: Apr. 28, 2015

(65) Prior Publication Data

US 2016/0093595 A1 Mar. 31, 2016

Related U.S. Application Data

(60) Provisional application No. 62/055,827, filed on Sep. 26, 2014.

(51) Int. Cl.
| | |
|---|---|
| H01L 35/24 | (2006.01) |
| H01L 51/00 | (2006.01) |
| H01L 23/544 | (2006.01) |
| H01L 21/00 | (2006.01) |
| H01L 25/16 | (2006.01) |
| H01L 25/00 | (2006.01) |

(52) U.S. Cl.
CPC ............. *H01L 25/167* (2013.01); *H01L 25/50* (2013.01)

(58) Field of Classification Search
CPC ............................. H01L 25/167; H01L 25/50
USPC ....................... 438/26; 257/40, 620
See application file for complete search history.

(56) References Cited

U.S. PATENT DOCUMENTS

| | | | |
|---|---|---|---|
| 6,888,374 B2 | 5/2005 | Bal | |
| 2010/0177793 A1* | 7/2010 | Rossi | ............... H01L 5/141 372/20 |
| 2015/0028866 A1 | 1/2015 | Parsa et al. | |
| 2015/0060893 A1* | 3/2015 | Cho | ............... H01L 51/5246 257/88 |
| 2015/0076530 A1* | 3/2015 | Lin | ............... H01L 33/58 257/88 |
| 2015/0340647 A1* | 11/2015 | Wang | ............... H01L 51/52 257/40 |

* cited by examiner

*Primary Examiner* — David S Blum
(74) *Attorney, Agent, or Firm* — Jacqueline J. Garner; Frank D. Cimino

(57) ABSTRACT

An optoelectronic packaged device includes stacked components within a package including a package substrate providing side and a bottom wall. The stacked components includes a comb structure on the bottom wall formed from a material having a thermal resistance > a substrate material for the bottom die providing spaced apart teeth separated by gaps. The bottom die has a top surface including electrical trace(s) and a light source die for emitting light coupled to the electrical trace and a bottom surface on the comb structure. A first cavity die is on the top surface of the bottom die or on legs of the package which extend above the bottom wall. An optics die is on the first cavity die, a second cavity die is on a sealing die which is on the optics die, and a photodetector (PD) die is optically coupled to receive light from the light source die.

15 Claims, 4 Drawing Sheets

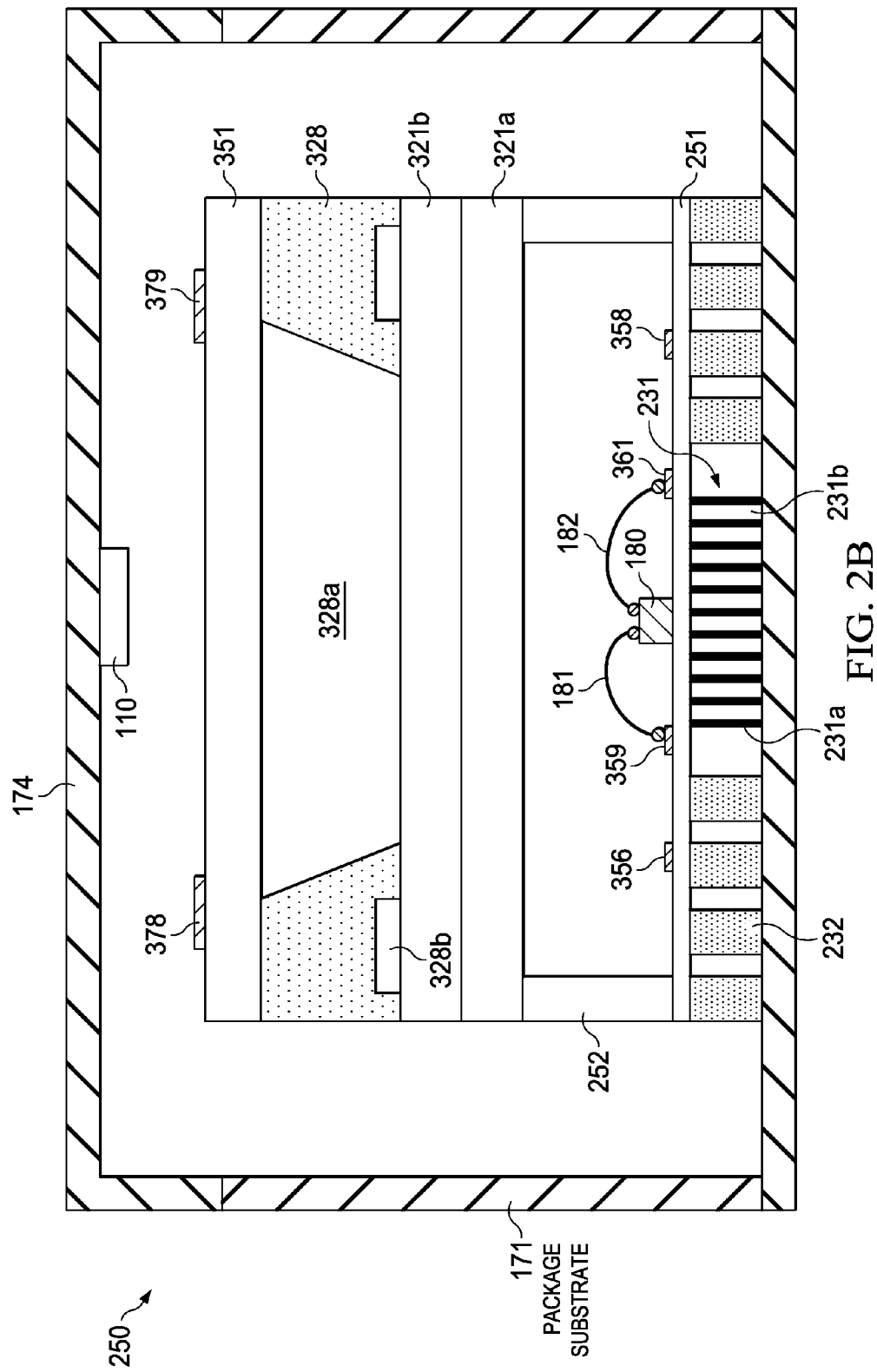

OPTICALLY PUMPED SENSORS OR REFERENCES WITH DIE-TO-PACKAGE CAVITIES

CROSS REFERENCE TO RELATED APPLICATIONS

This application claims the benefit of Provisional Application Ser. No. 62/055,827 entitled "Microfabricated atomic clocks (MFAC) & magnetometers (MFAM): high volume manufactural (HVM) magnetic characterization" filed Sep. 26, 2014, which is herein incorporated by reference in its entirety.

FIELD

Disclosed embodiments relate to stacked optoelectronic packages implementing optically pumped sensors or references, such as MFACs and MFAMs.

BACKGROUND

A variety of optoelectronic devices are packaged devices which include a photodetector (PD) and at least one light source that is operated under a vacuum. Conventional MFAC and MFAM packages include a vertically stacked structure inside a package material including a bottom die as a support having electrical traces and at least one light source (e.g., a laser die such as a vertical-cavity surface-emitting laser (VCSEL)) mounted thereon, a first cavity die on the bottom die providing a cavity over the light source, and an optics die on the first cavity die.

The electrical traces on the bottom die connect an external driver which drives the light source and includes traces configured for a resistive heater element, such as to provide heat to heat the light source die to a temperature of about 60 to 80° C. A second cavity die is on the optics die, other optical device(s) (e.g., a polarizer) is on the second cavity die, and a photodetector (PD) die is on a dielectric substrate over the other optical device(s). The package is a vacuum sealed package.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include optoelectronic packaged devices comprising a plurality of stacked components within a package including a package substrate providing side walls and a bottom wall. The stacked components includes a comb structure as a thermal barrier feature on the bottom wall of the package under the bottom die formed from a material having a thermal resistance above that of a substrate material for the bottom die providing a plurality of spaced apart teeth separated by gaps (e.g., air gaps). The bottom die has a top surface including thereon at least one electrical trace and a light source die for emitting light coupled to the electrical trace. A first cavity die is on the top surface of the bottom die or on legs of the package which extend above the bottom wall. An optics die is on the first cavity die, a sealing die is on the first cavity die, a second cavity die on the sealing die, and a photodetector (PD) die is optically coupled to receive light originating from the light source die.

BRIEF DESCRIPTION OF THE DRAWINGS

Reference will now be made to the accompanying drawings, which are not necessarily drawn to scale, wherein:

FIG. 2B is a cross-sectional depiction of another example optoelectronic packaged device having TBFs for reducing heat conducted out of the package from the heater element traces on the bottom die including a comb structure under the bottom die comprising a first material and a sacrificial structure outside the comb structure comprising a second material that is removed after forming the stack but before closing the lid, and from the heater element traces on the second mounting substrate a secondary cavity region on the second cavity die, according to an example embodiment.

DETAILED DESCRIPTION

Figure 1:
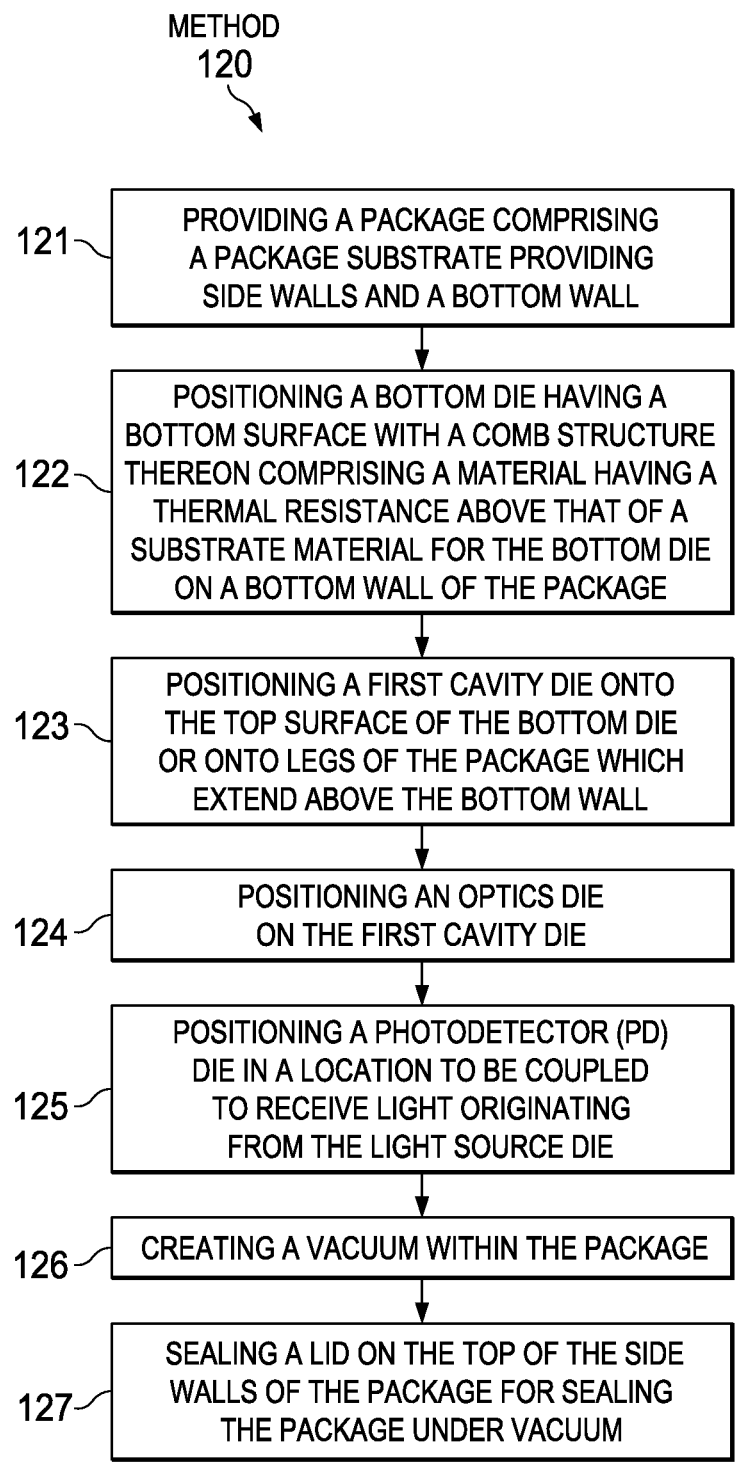
FIG. 1 is a flow chart that shows steps in an example method for forming an optoelectronic packaged device having at least one TBF for reducing heat conducted out of the package from the heater element traces on the bottom die and the heater element traces on second mounting substrate to reduce the power consumed by the device, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Disclosed embodiments recognize heat escaping from the package substrate such as to a PCB thereunder during operation of stacked optoelectronic packaged devices (e.g., microfabricated atomic clocks (MFAC) and magnetometers (MFAM)) results in increased power consumption needed to maintain the designed temperature for operation of the optoelectronic packaged device. Disclosed embodiments include optoelectronic packaged devices which have one or more TBFs which by reducing the heat generated by heater elements escaping from the package substrate reduce the power consumed by the optoelectronic packaged device.

FIG. 1 is a flow chart that shows steps in an example method 120 for forming an optoelectronic packaged device having at least one TBF which reduces the power consumed by the device, according to an example embodiment. Step 121 comprises providing a package comprising a package substrate providing side walls and a bottom wall. The package substrate material can comprise a plastic material or a ceramic material in some embodiments.

Step 122 comprises positioning a bottom die having a bottom surface with a comb structure comprising a plurality of spaced apart teeth thereon formed from a material having a higher thermal resistance compared to the substrate material (e.g., silicon) of the bottom die a bottom wall of the package. In one embodiment, the comb material comprises a thermally insulating material. As defined herein, thermally insulating material has a 25° C. bulk thermal conductivity <5 W/m·K. One example method to form the comb structure on the bottom surface of the bottom die is to cover the bottom surface of the bottom die with photoresist, which is then patterned to form a comb structure including spaced apart teeth, and a bake step is then used to harden the teeth of the combs.

The bottom die has a top surface including at least one electrical trace (generally a plurality of electrical traces) and a light source die for emitting light thereon. Standard pick-and-place may be used for this positioning and other die positioning described herein. The light source die can comprise a vertical-cavity surface-emitting laser (VCSEL) die. The electrical traces generally include electrical traces for coupling an external driver to drive the light source and traces configured to realize a resistive heater.

Step 123 comprises positioning a first cavity die onto the top surface of the bottom die (see FIG. 2B described below) or onto legs of the package (see FIG. 2A described below) which extend above the bottom wall. The first cavity die can have patterned grooves on its top side surface and its bottom side surface to provide another TBF (see FIG. 2A described below). Sand blasting, dry etching, or a timed wet etching can be used to form the patterned grooves.

Step 124 comprises positioning an optics die on the first cavity die. A second cavity die on a sealing die can be positioned over the optics die. The second cavity die can include an inner primary cavity and a secondary cavity region outside the inner primary cavity which can provide yet another TBF (see FIG. 2A described below). The secondary cavity region can be formed by a wet or a dry etch.

Step 125 comprises positioning a PD die in a location to be coupled to receive light originating from the light source die, such as in a line-of sight with the light originating from the light source. For example, the PD die can be mounted on a base portion of an inner package that is inside the package, where the inner package has an open top opposite the base portion that faces the bottom wall of the package (see FIG. 3 described below). The method can further comprise forming a secondary cavity region outside a primary cavity region for the second cavity die.

Step 126 comprises creating a vacuum within the package. Step 127 comprises sealing a lid on the top of the side walls of the package for sealing the package under vacuum.

Figure 2A:
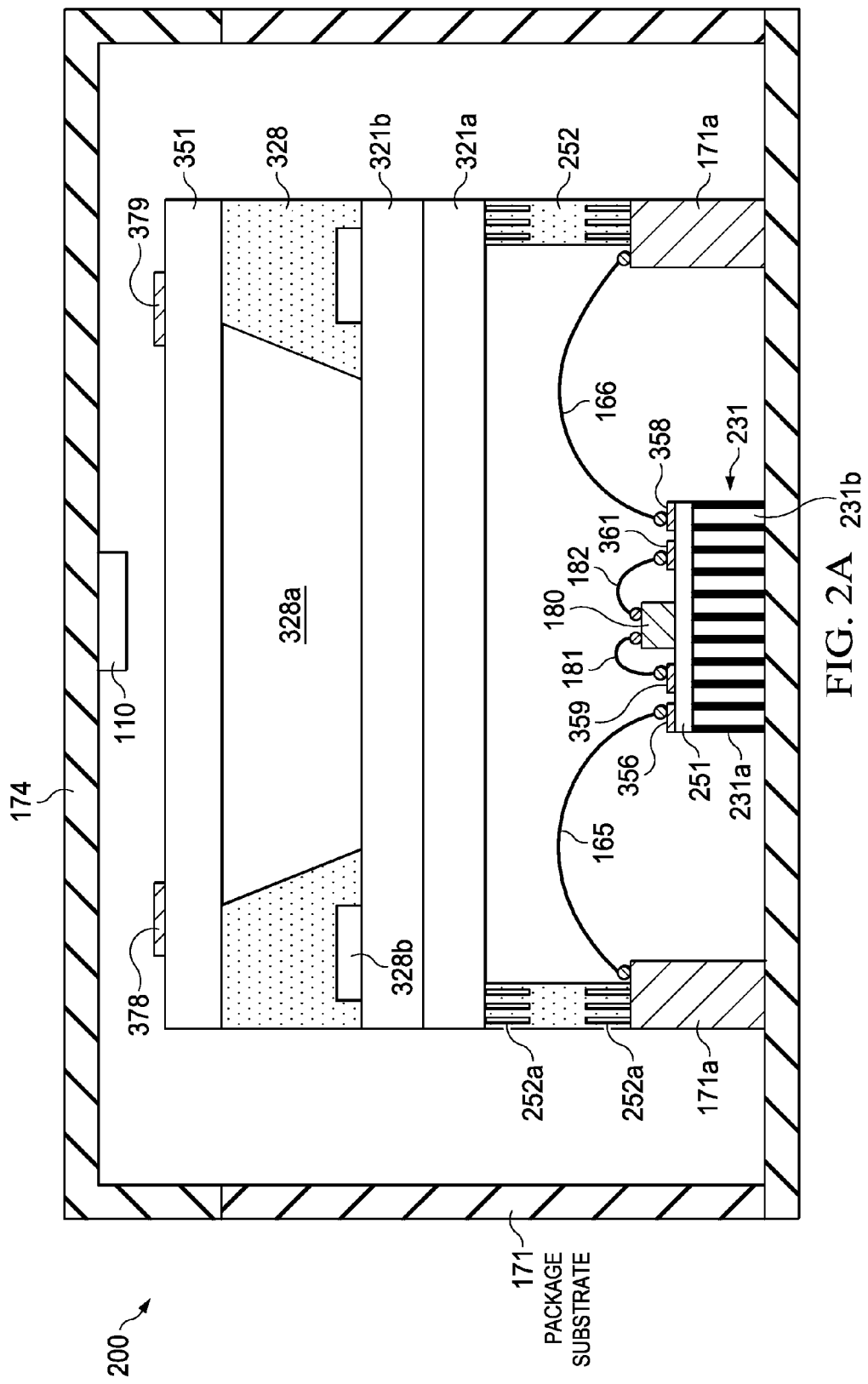
FIG. 2A is a cross-sectional depiction of an example stacked optoelectronic packaged device having TBFs for reducing heat conducted out of the package from the heater element traces on the bottom die including a comb structure under the bottom die and a reduced die area for the bottom die, and from the heater element traces on the second mounting substrate a secondary cavity region on the second cavity die, according to an example embodiment.

FIG. 2A is a cross-sectional depiction of an example optoelectronic packaged device (packaged device) 200 having TBFs for reducing heat conducted out of the package from the heater element traces (heater traces) 356 and 358 on the bottom die 251 including a comb structure 231 under the bottom die 251 which has a reduced die area, and from the heater traces 378 and 379 on second mounting substrate 351 by a secondary cavity region 328b on the second cavity die 328, according to an example embodiment. Packaged device 200 includes a plurality of stacked components within a package comprising a package substrate 171 providing side walls and a bottom wall for the package, and a lid 174 for sealing a top of the package.

The comb structure 231 has a high thermal resistance compared to the substrate of the bottom die 251 that is on a bottom wall of the package. As noted above, the teeth 231a of the comb structure 231 can comprise a polymer which can be a lithographically patternable/curable material. There are spaces (or gaps) 231b between the teeth 231a. In one embodiment the polymer comprises SU-8 which is a highly viscous epoxy-based negative photoresist that can be spun or spread over a thickness ranging from below 1 μm up to above 300 μm and still be processed with standard photolithography.

Besides the heater traces 356 and 358, the top surface of the bottom die 251 includes a plurality of bottom electrical traces shown as driver traces 359 and 361 and a light source die 180 for emitting light coupled to driver traces 359 and 361 by bond wires 181 and 182 respectively which provide coupling for an electrical bias to the electrodes of the light source die 180. Bond wires 165 and 166 are shown for providing bias from an external source to heater traces 356 and 358, respectively. Although not shown, there are also generally bond wires for coupling driver traces 359 and 361 to pins of the packaged device for biasing the light source die 180, and bond wires for biasing the heater traces 378 and 379.

The bottom die 251 is shown providing a reduced overlap to the package substrate because its relatively small die area, defined herein as being <50% of the area of the packaged device, which provides another TBF. The die size of bottom die 251 can be reduced to an essentially minimum dimension to accommodate its respective components including the light source die 180 and heater traces 356 and 358, and driver traces 359 and 361, being about 10% to 20% of the area of the packaged device 200.

A first cavity die 252 having a top side surface and a bottom side surface is on legs 171a of the package substrate 171. The first cavity die 252 is shown having etched patterned grooves 252a on both its top side surface and its bottom side surface, which provides another TBF. The optics die 321a is on the top side surface of the first cavity die 252, and a optically transparent sealing or die sheet (sealing die, for cavity sealing) 321b is on the optics die 321a. A second cavity die 328 on the sealing die 321b. The second cavity die 328 is shown including an inner primary cavity 328a and a secondary cavity region 328b outside the inner primary cavity 328a which provide yet another TBF. When the second cavity die 328 comprises a thermally conductive material such as silicon, etched portion form primary cavity 328a which form bridge structures that reduce overlap and thus the contact area to the die sheet 321b below which reduces heat conducted out of the packaged device 200. The second cavity die 328 can comprise glass. Replacing conventional silicon with a higher thermal resistance material for the substrate of the second cavity die 328 will enhance the thermal resistance.

The second mounting substrate 351 is on the second cavity die 328 having a top surface including a plurality of top electrical traces shown as heater traces 378 and 379 which as noted above each implement a resistive heating element. A PD die 110 is optically coupled to receive the light originating from the light source die 180, shown in FIG. 2A being in a line-of-sight location.

In one embodiment the die and substrates in the packaged device 200 are all formed from a thermally insulating material, such as a glass. For example, the bottom die 251, first cavity die 252, an optics die 321a and the second cavity die 328 can all comprise glass which may have a 25° C. bulk thermal conductivity of about 0.8 W/m·K, which can be compared to silicon which has 25° C. bulk thermal conductivity of about 149 W/m·K.

Figure 3:
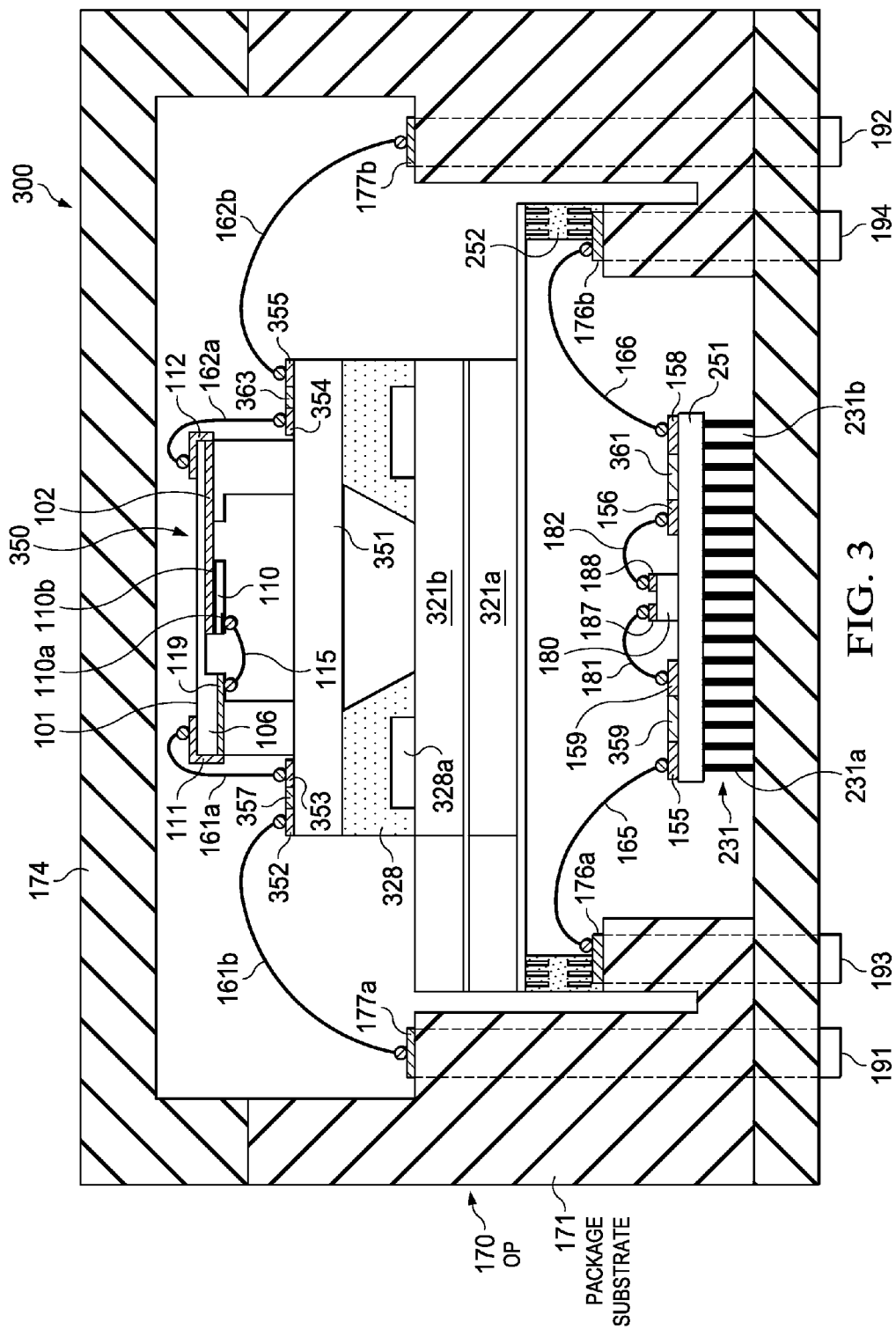
FIG. 3 is a cross-sectional depiction of another example optoelectronic packaged device including TBFs for reducing heat conducted out of the package from the heater element traces on the bottom die including a comb structure and from the heater element traces on the second mounting substrate a second cavity die having secondary cavity regions, according to an example embodiment, according to an example embodiment.

FIG. 2B is a cross-sectional depiction of another example optoelectronic packaged device (packaged device) 250 having TBFs including a comb structure 231 for reducing heat conducted out of the package from heater element traces 356 and 358 under the bottom die 251, and a secondary cavity region 328b on the second cavity die 328 for reducing heat conducted out of the package from the heater traces 378 and 379 on second mounting substrate 351, according to an example embodiment. Between the bottom side of the bottom die 251 and the bottom wall of the package substrate there are two different material structures. The material closer to the center of the bottom die 251 can be a first material that has a high thermal resistance relative to the substrate material of the bottom die 251 shown as the comb structure 231 having teeth as described above, and the structure outside the center can be a second material which can comprise a sacrificial material shown as 232 that is different from the first material that provides mechanical support during the assembly process for the optical stack which is removed by a dry etch or ash process before closing the lid 174. Example materials for the first material include polymers such as SU-8 r glass, and example materials for the second material include silicon which can be removed using a dry etch, such as a $XeF_2$ (or other silicon etch gas) dry etch Regarding an example method for forming the sacrificial layer, after securing the bottom die 251 to the bottom wall of the package substrate, such as by epoxy, subsequent components/dies in the stack can be placed on top of the bottom die 251. After full assembly of the stack, prior closing the final lid 174, the sacrificial layer can be removed by a dry etch or ash process that selectively removes the sacrificial layer, but not the teeth of the comb structure 231. The removal of the sacrificial layer reduces the overlap between the entire stack to the package substrate below which reduces heat conducted out of the package (e.g., such as to a PCB under the packaged device 250). FIG. 3 is a cross-sectional depiction of another example optoelectronic packaged device (packaged device) 300 including TBFs for reducing heat conducted out of the package substrate 171 from the driver traces 359 and 361 (and heater traces not shown) on the bottom die 251 including a comb structure 231, and from the heater traces 378 and 379 on second mounting substrate 351, and the second cavity die 328 having secondary cavity regions 328b, according to an example embodiment.

Packaged device 300 includes a first cavity die 252 on a bottom die 251. Electrical driver trace 359 is associated bond pads 155 and 159 and an electrical driver trace 361 with associated bond pads 156 and 158 on its top surface. The second mounting substrate 351 that includes bond pads 352 and 353 is coupled together by the metal trace shown 357, and bond pads 354 and 355 coupled together by the metal 363 shown. Package device 300 is shown including an inner package 350 inside an outer package (OP) 170. The inner package 350 has an open top opposite its base portion that faces the bottom wall of the package.

The PD die 110 includes a first contact comprising a front contact 110a connected to a first external bond pad (FEBP) 111 by routing comprising an internal bond wire 115. The PD die 110 also includes a second contact comprising a back contact 110b connected by routing comprising a back side metal layer 102 to a second external bond pad (SEBP) 112.

The inner package 350 shown includes a multi-layer first dielectric substrate including a first dielectric level 101, and a second dielectric level 106 above the first dielectric level 101. As known in the art, the multi-layer first dielectric substrate can be an integral (one-piece) substrate so that the first dielectric level 101 and second dielectric level 106, together with any intervening metal layer, are configured without the need for any adhesive. For example, ceramic packages have build-up layers that allow integrated metal connections laterally and vertically to the reach the outer surface of the package.

The first dielectric level 101 includes a top side including a first die attach area having back side metal layer 102 thereon extending to a first outer edge of the inner package 350, and the FEBP 111 and SEBP 112 extend over a portion of a bottom side of the first dielectric level 101. The second dielectric level 106 is above the first dielectric level 101 framing the die attach area including a wire bonding area having a second metal layer 119 extending to the second outer edge of the inner package 350.

The front contact 110a can comprise bond pad metal connected to an n+ region and the back contact 110b can comprise bond pad metal connected to a p+ region. The back contact 110b can be the entire bottom side of the PD die 110. The internal bond wire 115 connects the front contact 110a to the second metal layer 119.

The PD die 110 can comprise any suitable front-side illuminated PD including a photodiode, a phototransistor or a charge-coupled device (CCD), which all can be off-the-shelf PD die. In one embodiment the PD die 110 includes a first active layer having a first conductivity (e.g., n+), a second active layer having a second conductivity (e.g., p+) opposite the first conductivity, and an intrinsic layer separating the first and second active layers (to form a PIN diode).

The inner package 350 is on the second mounting substrate 351. Bond wire 161a connects the FEBP 111 to bond pad 353 and bond wire 161b connects the bond pad 352 to upper wire bond area 177a. Bond wire 162a connects the SEBP 112 to bond pad 354 and bond wire 162b connects bond pad 355 to upper wire bond area 177b.

First bond wires shown as bond wire 161a and bond wire 161b together connect the FEBP 111 to the wire bond area 177a which connects the first terminal 191 of the OP 170, second bond wires 162a and 162b together connect the SEBP 112 to the wire bond area 177b which connects to the second terminal 192 of the OP 170. A third bond wire 165 connects bond pad 155 at the end of metal trace 359 to an outer bond pad 176a which through metal trace 359 and the first bond wire 181 connects to the first electrode 187 of the light source die 180 to the third terminal 193 of the OP 170, and a fourth bond wire 166 connects from bond pad 158 to an outer bond pad 176b which through bond wire 182 from the bond pad 156 at the end of the metal trace 357 connects the second electrode 188 of the light source die 180 to a fourth terminal 194 of the OP 170. The lid 174 hermetically seals the OP 170.

Light source die 180 can comprise a VCSEL in one specific embodiment. An optically transparent sealing or die sheet (sealing die) 321b on an optics die 321a is shown between the first cavity die 252 and second cavity die 328. The sealing die 321b can comprise an optical glass which seals the lower end of the upper cavity defined by the second cavity die 328 that is sealed on the upper end by a second mounting substrate 351. The optics die 321a can comprise an optical filter or polarizer. The second mounting substrate 351 can comprise an optical glass, such as a borosilicate glass, for example BOROFLOAT 33.

Disclosed embodiments being wafer/die level processed provide low cost, high throughput manufacturing, and by virtue of disclosed TBFs reduce heat conducted out of the package from the heater traces in the optoelectronic packaged device. Applications for disclosed embodiments generally include all applications having a light source such as a laser diode along with an inbuilt monitor photodetector. One specific example is a magnetometer physics package. Other examples include an atomic clock, and a motion sensor device.

Disclosed embodiments can be integrated into a variety of assembly flows to form a variety of different optoelectronic devices and related products. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A stacked optoelectronic packaged device (packaged device), comprising:
   a plurality of stacked components within a package comprising a package substrate providing side walls and a bottom wall for said package, and a lid for sealing a top of said package, said plurality of stacked components including:
      a comb structure on said bottom wall comprising a material having a thermal resistance above that of a substrate material for a bottom die comprising a plurality of spaced apart teeth separated by gaps;
      said bottom die having a top surface including thereon at least one electrical trace and a light source die for emitting light coupled to said electrical trace and a bottom surface on said comb structure;
      a first cavity die on said top surface of said bottom die or on legs of said package which extend above said bottom wall;
      an optics die on said first cavity die;
      a sealing die on said optics die;
      a second cavity die on said sealing die, and
      a photodetector (PD) die optically coupled to receive said light originating from said light source die.

2. The packaged device of claim 1, wherein said package substrate further provides said legs, said first cavity die is on said legs, said first cavity die has patterned grooves on its top side and bottom side faces, and a size of said bottom die is <½ an area of said stacked optoelectronic packaged device.

3. The packaged device of claim 1, wherein said second cavity die includes a secondary cavity region outside a primary cavity region.

4. The packaged device of claim 1, wherein said first cavity die, said optics die and said second cavity die all comprise thermally insulating materials.

5. The packaged device of claim 4, wherein said substrate material comprises a thermally insulating material.

6. The packaged device of claim 1, further comprising at least one optical device on said second cavity die.

7. The packaged device of claim 1, wherein said comb structure is an inner comb structure, further comprising a secondary cavity region outside said inner comb structure.

8. A method of forming a stacked optoelectronic packaged device (packaged device), comprising:
   providing a package comprising a package substrate providing side walls and a bottom wall;
   positioning a bottom die having a bottom surface with a comb structure thereon comprising a material having a thermal resistance above that of a substrate material for said bottom die comprising a plurality of spaced apart teeth separated by gaps onto said bottom wall of said package, wherein said bottom die has a top surface including at least one electrical trace and a light source die for emitting light thereon;
   positioning a first cavity die onto said top surface of said bottom die or to legs of said package which extend above said bottom wall;
   positioning an optics die on said first cavity die, a sealing die on said optics die, and a second cavity die on said sealing die;
   positioning a photodetector (PD) die in a location to be coupled to receive said light originating from said light source die;
   creating a vacuum within said package, and
   sealing a lid on a top of said side walls for sealing said package under said vacuum.

9. The method of claim 8, wherein said package substrate further provides said legs, wherein said first cavity die is positioned on said legs, and wherein a size of said bottom die is <½ an area of said stacked optoelectronic packaged device, further comprising:
   forming patterned grooves on top side and bottom side faces said first cavity die before said positioning said first cavity die.

10. The method of claim 8, further comprising positioning at least one optical device on said second cavity die.

11. The method of claim 8, further comprising forming a secondary cavity region outside a primary cavity region for said second cavity die.

12. The method of claim 8, wherein said first cavity die, said optics die and said second cavity die all comprise thermally insulating materials.

13. The method of claim 12, wherein said substrate material comprises a thermally insulating material.

14. The method of claim 8, wherein said PD die is mounted on a base portion of an inner package that is inside said package, said inner package having an open top opposite said base portion that faces said bottom wall of said package.

15. The method of claim 8, wherein there is a second material structure outside said comb structure comprising a material different from said substrate material which provides mechanical support during said method, further comprising removing said second material structure using a dry etch or ash process before sealing said lid.

* * * * *